US007820365B1

(12) United States Patent
Williams et al.

(10) Patent No.: US 7,820,365 B1
(45) Date of Patent: Oct. 26, 2010

(54) METHOD TO FABRICATE A TILTED LOGPILE PHOTONIC CRYSTAL

(75) Inventors: John D. Williams, Albuquerque, NM (US); William C. Sweatt, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 569 days.

(21) Appl. No.: 11/779,605

(22) Filed: Jul. 18, 2007

(51) Int. Cl.
G03F 7/26 (2006.01)
(52) U.S. Cl. .................. 430/311; 430/397; 430/394
(58) Field of Classification Search .............. 430/311, 430/394, 312, 397, 5, 321
See application file for complete search history.

(56) References Cited

U.S. PATENT DOCUMENTS

| 6,611,085 B1 | 8/2003 | Gee et al. |
|---|---|---|
| 6,869,330 B2 | 3/2005 | Gee et al. |

OTHER PUBLICATIONS

E. Yablonovitch at al, "Photonic Band Structure: The Face-Centered-Cubic Case", Physical Review Letters, vol. 63, No. 18, Oct. 30, 1989, pp. 1950-1953.
H. S. Sozuer et al, "Photonic Band Calculations for Woodpile structures", Journal of Modern Optics, 1994, vol. 41, No. 2, pp. 231-239.
Aili Ting, "Submicron resolution of secondary radiation in LIGA polymethyl-methacrylate resist exposure", Society of Photo-Optical Instrumentation Engineers, J. Microlith., Microfab., Microsyst., vol. 3, No. 3, 2004 pp. 413-422.
Ovidiu Toader et al, "Slanted-pore photonic band-gap materials", The American Physical Society, Physical Review E, 71, (2005), 036605-1 through-14.
Ovidiu Toader et al, "Photonic Band Gaps Based on Tetragonal Lattices of Slanted Pores", The American Physical Society, Physical Review Letters, vol. 90, No. 23, (2003), 233901-1 through-4.
J. D. Williams at al, "Tilted Logpile Photonic Crystals using the LIGA Technique", Proc. of SPIE, vol. 6289, 2006, 62890A-1 through-7.
E. Yablonovitch, "Photonic band-gap structures", J. Opt. Soc. Am. B/vol. 10, No. 2, Feb. 1993, pp. 283-295.
F. Romanato et al, "Fabrication of 3D metallic photonic crystals by X-ray lithography", Microelectronic Engineering 67-68, (2003), pp. 479-486.

(Continued)

*Primary Examiner*—Mark F Huff
*Assistant Examiner*—Caleen O Sullivan
(74) *Attorney, Agent, or Firm*—Kevin W. Bieg

(57) ABSTRACT

A method to fabricate a tilted logpile photonic crystal requires only two lithographic exposures and does not require mask repositioning between exposures. The mask and photoresist-coated substrate are spaced a fixed and constant distance apart using a spacer and the stack is clamped together. The stack is then tilted at a crystallographic symmetry angle (e.g., 45 degrees) relative to the X-ray beam and rotated about the surface normal until the mask is aligned with the X-ray beam. The stack is then rotated in plane by a small stitching angle and exposed to the X-ray beam to pattern the first half of the structure. The stack is then rotated by 180° about the normal and a second exposure patterns the remaining half of the structure. The method can use commercially available DXRL scanner technology and LIGA processes to fabricate large-area, high-quality tilted logpile photonic crystals.

16 Claims, 8 Drawing Sheets

OTHER PUBLICATIONS

C. Cuisin et al, "Sub-micrometre dielectric and metallic yablonovite structures fabricated from resist templates", Optical and Quantum Electronics, vol. 34, 2002, pp. 13-26.

Markus Deubel et al, "Direct laser writing and characterization of "Slanted Pore" Photonic Crystals", Applied Physics Letters, vol. 85, No. 11, 2004, pp. 1895-1897.

G. Feiertag at al, "Fabrication of photonic crystals by deep x-ray lithography", Applied Physics Letters, vol. 71, No. 11, 1997, pp. 1441-1443.

K. M. Ho et al, "Photonic band gaps in three dimensions: new layer-by-layer periodic structures", Solid State Communications, vol. 89, No, 5 pp. 413-416, 1994.

Sajeev John, "Strong Localization of Photons in Certain Disordered Dielectric Superlattices", Physical Review Letters, vol. 58, No. 23, 1987, pp. 2486-2489.

S. Y. Lin, et al, "A three-dimensional photonic crystal operating at infrared wavelengths", Letters to nature, vol. 394, 1998, pp. 251-253.

Shawn-Yu Lin et al, "Photonic band-gap microcavities in three dimensions", Physical Review B, Third Series, vol. 59, No. 24 1999-II, pp. R15 579-582.

John T. Neu et al, "Extended performance infrared directional reflectometer for the measurement of total, diffuse and specular reflectance", SPIE vol. 2260, Stray Radiation in Optical Systems III, 1994, pp. 62-73.

F. Romanato, et al, "X-ray and electron-beam lithography of three-dimensional array structures for photonics", J. Vac. Sci. Technol. B, vol. 21, No. 6, 2003, pp. 2912-2917.

METHOD TO FABRICATE A TILTED LOGPILE PHOTONIC CRYSTAL

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to methods to fabricate three-dimensional microstructures and, in particular, to a method to fabricate a tilted logpile photonic crystal.

BACKGROUND OF THE INVENTION

Photonic crystals are the optical analogues of semiconductors. In a semiconductor, the electronic bandgap arises as a result of a periodic array of electronic potentials defined by the material and its crystalline structure. In a photonic crystal, the photonic bandgap arises as a result of a structured periodic variation in refractive index of two or more dielectric materials. Optical waves and frequencies lying within this forbidden bandgap cannot propagate through the photonic crystal without severe attenuation. In particular, three-dimensional (3-D) photonic crystals exhibit omnidirectional reflection of incident waves for all directions and polarizations within the bandgap. The average wavelength of the photonic bandgap is approximately twice the lattice constant of the photonic crystal structure. Feature sizes associated with photonic crystals are on the order of one-eighth the wavelength of light. These considerations suggest that these artificial photonic crystals can be engineered to have specific photonic properties by controlling the dimensions and materials comprising the lattice.

Just as semiconductors revolutionized electronics, it is expected that photonic crystals will revolutionize optical computing and communications. However, the field of photonic crystals is in its infancy. Development of photonic crystals has been hampered because the production of high quality photonic crystals currently requires expensive, complex fabrications schemes. To replace conventional optical materials for integrated optical applications, a simple, low-cost manufacturing process is needed for producing 3-D photonic crystals and embedding several other optical components onto a single chip.

Yablonovitch and John were the first to suggest a 3-D photonic crystal for optical applications. See E. Yablonovitch and T. J. Gmitter, *Phys. Rev. Lett.* 63, 1950 (1989); and S. John, *Phys. Rev. Lett.* 58, 2486 (1987). Yablonovitch proposed that a slanted-pore structure ("Yablonovite") comprising two widely different indexes of refraction could be created by drilling periodic cylindrical holes with a diameter of between 0.1 and 0.2 of the desired wavelength into a slab at three different angular orientations. See E. Yablonovitch, *J. Opt. Soc. Am.* 10, 283 (1993). The 3-D periodicity of the Yablonovite structure produced a photonic band gap to all angles of incident light with wavelengths approximately twice the lattice spacing.

Deep X-ray lithography (DXRL) can be used to fabricate the 3-D Yablonovite structure. DXRL uses X-rays generated by a synchrotron light source to pattern thick photoresist. X-rays emitted from the light source are highly collimated and capable of patterning photoresist, such as polymethyl methacrylate (PMMA), with critical dimensions of less than 1 µm and aspect ratios significantly greater than 10:1. To fabricate Yablonovite with DXRL, an X-ray mask is needed that consists of a hexagonal array of round holes. This mask is mounted in near-proximity to the surface of a thick layer of photoresist. It is then exposed three times using collimated X-rays arriving from an elevation angle of 53° and from three azimuth angles: 0°, 120°, and 240°. See E. Yablonovitch and K. M. Leung, *Physica B* 175 (1-3), 81 (1991). The Yablonovite structure has been successfully fabricated in PMMA by several researchers. See G. Feiertag et al., *Appl. Phys. Lett.* 71(11), 1441 (1997); C. Cuisin et al., *Optical and Quantum Electronics* 34, 13 (2002); and F. Romanato et al., *Microelectronic Engineering* 67-68, 479 (2003).

However, because there are circular holes in the Yablonovite-structure mask and the X-rays pass through the holes at a significant angle, ellipses are patterned into the photoresist. X-ray masks are typically 5- to 8-µm-thick, so at the 37° angle of incidence, the X-rays are further vignetted. With this fabrication process, Yablonovite comprising 6-µm features or greater can be made with these thick masks, but these large feature sizes are not particularly useful for mid-IR applications. DXRL masks as thin as 0.7 µm have been used to demonstrate Yablonovite patterns in PMMA with smaller feature sizes. However, line broadening of the exposed PMMA structure could not be eliminated using this thin mask. See F. Romanato et al., *J. Vacuum Science and Tech. B* 21(6), 2912 (2003).

Further, the mask/resist combination must be exposed three separate times to create the Yablonovite structure. Where the holes in the structure overlap one-another, the X-ray dose is a factor-of-3 greater than where the holes are not overlapped. Also, the X-ray beams are attenuated through the thickness of the thick photoresist—preferably by a factor-of-5 to minimize beam time and not overexpose the top surface. Therefore, the X-ray flux in the exposed resist can vary by as much as a factor-of-15. Gas can be generated in the overexposed areas due to resist degradation, producing internal stress in the pattern that can damage the unexposed regions of the polymer resist. See J. Mohr et al., *Macromolecular Chemistry: Macromolecular Symposium* 24, 231 (1989).

Finally, X-rays that reach the substrate and plating base can be absorbed at the resist/substrate interface. The X-rays can produce secondary emissions, some of which radiate back into the photoresist and expose the bottom portion of the resist. See A. Ting, *Journal of Microlithography, Microfabrication, and Microsystems* 3(3), 413 (2004). Therefore, the bottom of the structure can be severely damaged and attachment of the photoresist to the substrate can be greatly weakened. This weakness can be a significant problem because the photoresist expands during the development. Therefore a contiguous structure, such as the mold for Yablonovite, tries to grow relative to the unexposed photoresist surrounding it. This growth creates large compressive stresses in the photoresist. These stresses are relieved when the structure detaches itself from the substrate.

As a result of these fabrication difficulties, the Yablonovite structure has limited utility for practical applications. Further, to date, no one has been able to plate metal or other high index material into a template mold made of the developed photoresist.

In the late 1990's, researchers at Iowa State University developed a model design for producing a wider 3-D bandgap using a logpile (or woodpile) structure. This logpile structure is equivalent to a face-centered-cubic crystal when the fill fraction is near 28%. See K. Ho et al., *Solid State Comm.* 89, 413 (1994); and H. S. Sozuer and J. P. Dowling, *J. Modern*

Optics 41, 231 (1994). The logpile structure can be fabricated using traditional lithographic patterning techniques to create 3-D photonic crystals for both visible and infrared applications. This logpile structure was first fabricated in silicon by Lin et al. using a surface micromachining method, wherein the layers of logs are built up sequentially, to provide a wide bandgap at wavelengths from 8 to 14 µm. See S.-Y. Lin et al. *Phys. Rev. B* 59, 579 (1999); and U.S. Pat. No. 6,869,330 to Gee et al.

In FIG. 1 is shown a perspective-view schematic illustration of the logpile structure 10 that can be fabricated on a substrate 14 using the surface micromachining method of Lin et al. The 3-D logpile structure comprises alternating layers 27', 27, 29', and 29, each layer comprising an evenly spaced row of parallel "logs" or rods 12 of a dielectric material (e.g., silicon or tungsten). The rods have a width of w. The spaces 13 between the rods 12 can be filled with air (as shown) or a second dielectric material. For a four-layer photonic crystal 10, the one-dimensional rods 12 have a stacking sequence that repeats itself every four layers with a repeat distance of c. Within each layer 27', 27, 29', or 29, the axes of the rods 12 are parallel to each other with a pitch of d. Alternate layers are rotated by 90 degrees relative to the previous layer. Between each alternating parallel layer 27 and 29, or 27' and 29', the rods are shifted relative to each other by 0.5 d. The resulting structure 10 has a face-centered-tetragonal lattice symmetry of which the diamond structure is a subset.

For the special case of $c/d=1.414$, the crystal 10 can be derived from a face-centered-cubic unit cell with a basis of two rods.

Logpile structures of both silicon and tungsten have been fabricated by Lin et al. For the tungsten photonic crystal, the tungsten rods were approximately $w=1.2$ µm wide and spaced at a pitch of $d=4.2$ µm, thereby providing a band edge at $\lambda=5$ µm. Unfortunately, fabrication of this logpile structure by surface micromachining is difficult. The vertical topology of the 3-D logpile structure is built up, layer-by-layer, by repetitive deposition and etching of multiple dielectric films, requiring multiple aligned lithographic patterning steps. To simplify the fabrication of logpile photonic crystals, Toader et al. developed a method to fabricate a tilted logpile structure that required only two lithographic exposures and only one repositioning of the mask between exposures. See O. Toader et al., *Phys. Rev. Lett.* 90(23), 233901 (2003); and O. Toader et al., *Phys. Rev. E.* 71, 036605 (2005). In FIG. 2B is shown a side-view schematic illustration of Toader's tilted logpile structure 20 patterned in a thick layer of photoresist 23 on a substrate 24 after the two exposures. The tilted logpile 20 has the same lattice structure as Lin's conventional logpile 10, but the tilted logpile 20 is simply rotated with respect to the substrate 24 by 90 degrees out-of-plane and 45 degrees in-plane to orient the <001> direction parallel to the substrate 24, rather than normal to the substrate 14 (i.e., for the tilted logpile 20, the <110> direction is normal to the plane of the substrate 24 and the <001> direction is into the plane of FIG. 2B).

In FIG. 2A is shown a top-view schematic illustration of a portion of Toader's mask 25 comprising a pattern of openings 26 and 28 in an X-ray-absorbing material 22 on a transparent membrane substrate (this mask portion will pattern four layers in the <001> direction—an actual mask would comprise an array of mask openings to pattern a 3-D photonic crystal comprising a plurality of unit cells). Toader's method uses two exposures and a single mask repositioning between exposures to fabricate the tilted logpile structure 20 (exemplary exposures through a single representative mask opening 26 or repositioned mask opening 26' are shown in FIGS. 2A-2C).

As shown in FIG. 2B, the mask 25 is mounted in near-proximity to the surface of the photoresist 23. A first exposure, with the incident radiation 21 tilted at a +45 degree angle with respect to the mask normal N and aligned with the mask openings, patterns the first half of the logpile structure 20 into the resist 23. The first exposure therefore patterns a layer of rods 27 through mask openings 26 and a layer of rods 29 through mask openings 28 parallel to the <010> lattice direction. The mask 25 is then repositioned on the photoresist 23 by one-half the distance to the pattern's nearest neighbor. The second exposure is then performed with incident beam 21', also at a 45 degree tilt angle but after rotating the repositioned mask 25 and substrate 24 by 180 degrees, to pattern the other half of the logpile structure 20 into the resist 23. This rotation is equivalent to performing the second exposure with the incident beam 21' at a −45 degree tilt angle with respect to the mask normal N without the mask/substrate rotation. The second exposure therefore patterns layers of rods 27' and 29' parallel to the <100> lattice direction through the repositioned mask openings 26' and 28', respectively.

In FIG. 2C is shown an end-view schematic illustration of Toader's tilted logpile structure. The patterned rods 27, 27', 29, and 29' in adjacent layers are parallel to each other and non-overlapping.

When using a positive photoresist with this mask pattern, development of the patterned resist produces an inverse tilted logpile structure comprising layers of holes in the developed resist. Therefore, Toader further suggested that the developed photoresist could be used as a template mold to fabricate a tilted logpile structure of metallized rods using a LIGA process. LIGA is the German acronym for a MEMS processes utilizing deep X-ray Lithography, Galvanoforming, and Abformung (injection molding) to create plastic, metal, and ceramic microparts with very high aspect ratios and critical dimensions ranging from a few microns to a few centimeters. The first step of the LIGA process is to use DXRL to pattern thick photoresist. The exposure is commonly performed using a metallized substrate with resist either spin coated or laminated over the metallized surface. The patterned photoresist is then developed in a liquid solvent to remove the exposed low molecular weight polymeric materials (i.e., with a positive resist) leaving the unexposed material defined by X-ray exposure. The second step in the LIGA process uses electroplating to deposit metal into the developed high-aspect-ratio pattern. Subsequent removal of the remaining photoresist results in a free standing metal structure. Using a similar LIGA process, a tilted logpile structure can also be fabricated using metal, plastic, ceramic, or glass to fill an inverse tilted logpile mold.

Toader's tilted-logpile fabrication method is much simpler than the layer-by-layer logpile fabrication method of Lin et al. In addition, the overall X-ray dose required to fabricate the tilted logpile is reduced compared to that required to fabricate Yablonovite, since only two exposures are necessary. Further, because the exposed regions do not overlap, the dose does not have the factor-of-3 variation between the overlapped and non-overlapped regions found in the Yablonovite fabrication method.

Unfortunately, hardware requirements for submicron translation and alignment of a DXRL mask to a substrate between exposures have prevented the production of large-area, high-quality tilted logpile photonic crystals using Toader's method. Therefore, a need remains for a simple method to fabricate large-area, high-quality tilted logpile photonic crystals.

SUMMARY OF THE INVENTION

The present invention is directed to a method to fabricate a tilted logpile photonic crystal, comprising providing a substrate coated with a photoresist; providing a lithographic mask comprising a pattern of mask openings to pattern a tilted logpile structure in the photoresist with an incident beam from a collimated X-ray source; mounting the mask spaced a distance from the surface of the photoresist; tilting the mounted mask and substrate at a crystallographic symmetry angle (e.g., 45 degrees) toward the incident beam and aligning the incident beam with the mask openings; rotating the mounted mask and substrate through a stitching angle about the mask normal; exposing the photoresist to the incident beam through the mask openings to pattern a first half the tilted logpile structure in the photoresist; rotating the mounted mask and substrate by 180 degrees about the mask normal; and exposing the photoresist to the incident beam through the mask openings to pattern a second half of the tilted logpile structure in the photoresist, thereby forming a tilted logpile structure patterned in the photoresist. The tilted logpile structure comprises a cubic or rhombic structure and, preferably, a face-centered-cubic structure. The stitching angle θ can be selected according to tan 8=0.5w/s, where w is the width of the mask opening and s is distance spaced, and is preferably less than 10 degrees. The photoresist can comprise a negative or a positive photoresist.

The method can further comprising developing the patterned photoresist to provide an inverse logpile structure. A dielectric material can then be deposited into the holes of the inverse logpile structure to provide a tilted logpile structure comprising rods of the dielectric material embedded in photoresist. The remaining photoresist can be removed to provide a tilted logpile structure comprising rods of the dielectric material in air. The dielectric material can comprise plastic, metal, ceramic, or glass. For example, the metal can comprise tungsten, gold, silver, nickel, or copper. The metal can also comprise magnetic materials, such as NiFe, NiFeCo, NiCr, or NiCo alloy.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 5A shows a side-view SEM having a 250-μm field-of-view, oriented along the <111> direction. FIG. 5B shows a side-view SEM having a 50-μm field-of-view. FIG. 5C shows a top-view SEM having a 20-μm field-of-view, oriented along the <110> direction. FIG. 5D shows a 45° view SEM of a lattice defect.

DETAILED DESCRIPTION OF THE INVENTION

The present invention is directed toward a method to fabricate a tilted logpile photonic crystal that eliminates the need for mask repositioning altogether. The method described herein uses DXRL and LIGA processes to fabricate the tilted logpile photonic crystal. Instead of exposing one half of the structure and repositioning the mask prior to exposing the second half, according to the method of Toader, the method of the present invention does not require mask repositioning between exposures. According to the present method, the mask and substrate are spaced a fixed and constant distance apart using a spacer. The stack including the mask, spacer, and resist-coated substrate is then clamped together prior to lithographic exposure. The stack is then tilted at a crystallographic symmetry angle (e.g., 45 degrees) relative to the X-ray beam and rotated about the surface normal until the mask is aligned with the X-ray beam. The stack is then rotated in plane by a small stitching angle to generate a stitched resist pattern when exposed to the X-ray beam. A first exposure is then taken to pattern the first half of the tilted logpile structure. The clamped mask/substrate is then rotated by 180° about the normal and a second exposure patterns the remaining half of the tilted logpile structure. This produces unit cells that deviate from perfect cubes by roughly the same angle.

The method of the present invention can be performed with commercially available DXRL scanner technology and does not require fine alignment of the mask and substrate. However, other lithographic methods using collimated or directed beams, such as photo- or electron-beam-lithography, can also be used. Whereas the method described below is directed to fabrication of a face-centered-cubic structure, the method can be used to pattern a wide variety of different crystallographic structures within the resist, including cubic, rhombic, and diamond-like structures, by varying the exposure and stitching angles to generate the desired pattern.

Figure 1:
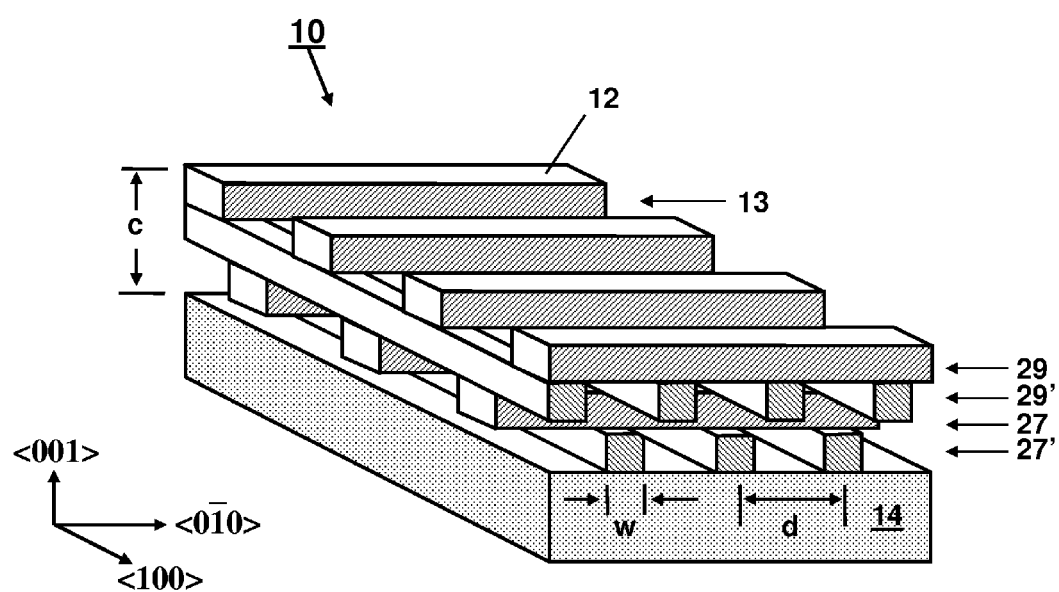
FIG. 1 shows a perspective-view schematic illustration of a logpile photonic crystal that can be fabricated on a substrate by surface micromachining.
Figure 2A:
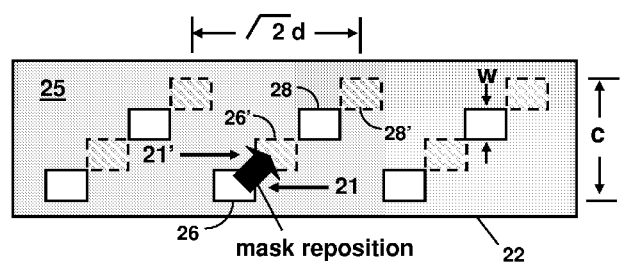
FIG. 2A shows a top-view schematic illustration of a mask that uses two lithographic exposures and a single mask repositioning between the exposures to fabricate a tilted logpile structure according to the method of Toader et al.
Figure 2B:
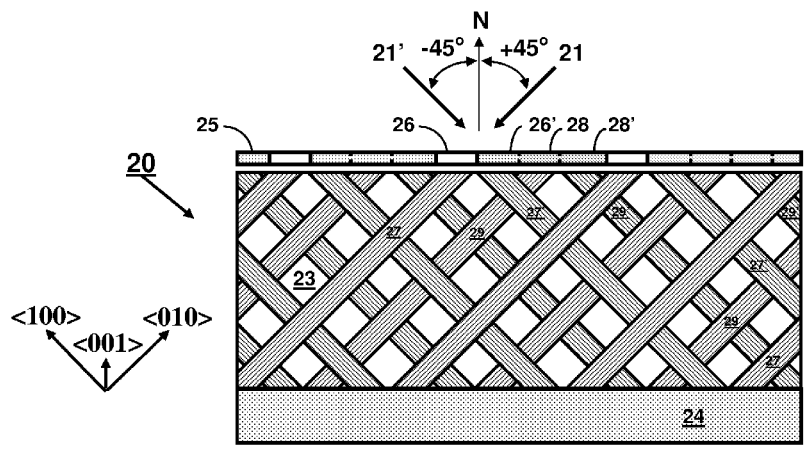
FIG. 2B shows a side-view schematic illustration of the tilted logpile structure patterned in a photoresist.
Figure 2C:
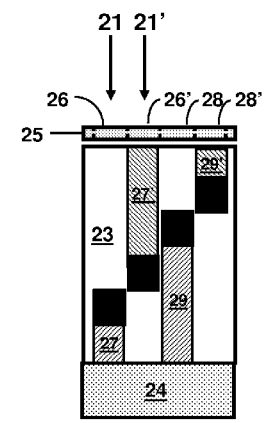
FIG. 2C shows an end-view schematic illustration of the tilted logpile structure.
Figure 3A:
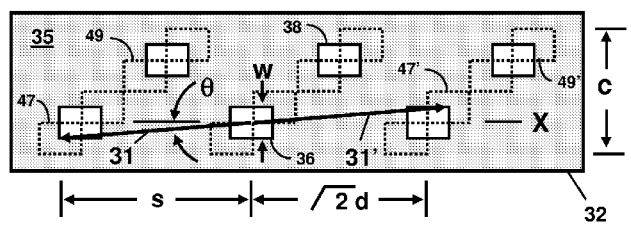
FIG. 3A shows a top-view schematic illustration of a mask that uses two lithographic exposures but no mask repositioning to fabricate the tilted logpile structure of the present invention.
Figure 3B:
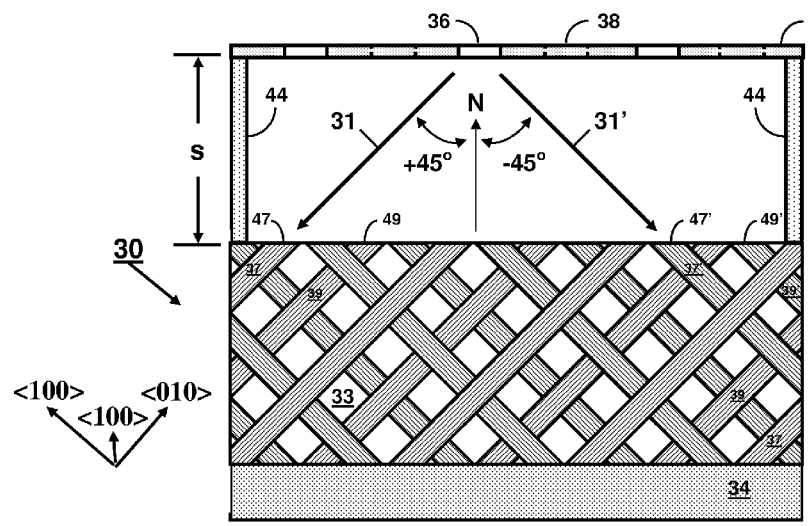
FIG. 3B shows a side-view schematic illustration of the tilted logpile structure patterned in a photoresist.

In FIG. 3B is shown a side-view schematic illustration of the tilted logpile structure 30 of the present invention patterned in a thick photoresist 33 on a substrate 34. The tilted logpile 30 has nearly the same lattice structure as Toader's tilted logpile 20. However, as shown in end-view schematic illustration FIG. 3C, the alternating tilted logpile layers 37, 37', 39, and 39' are skewed from parallel by a small stitching angle, θ, that enables the photoresist 33 to be patterned with only two exposures and no mask repositioning between the exposures.

Figure 3C:
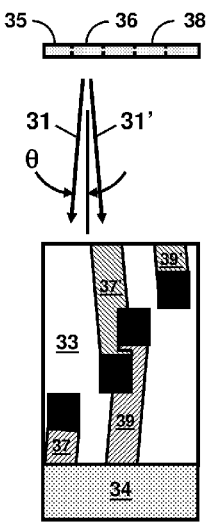
FIG. 3C shows a side-view schematic illustration of the tilted logpile structure.

In FIG. 3A is shown a top-view schematic illustration of a portion of a mask 35, comprising a pattern of mask openings 36 and 38 in an X-ray-absorbing material 32 on a transparent membrane substrate. The method uses two exposures, but no mask repositioning between exposures, to fabricate the tilted logpile structure 30 (exemplary exposures through a single representative mask opening 36 are shown in FIGS. 3A-3C).

As shown in FIG. 3B, the mask 35 is spaced at a distance s from the surface of the photoresist 33 by spacers 44. The mask 35 is clamped to spacer/photoresist/substrate. As with Toader's method, the incident radiation 31 is tilted at a crystallographic symmetry angle with respect to the mask normal N and rotated about the normal to align the direction of the incident radiation 31 with the axis X of the mask openings. For a face-centered-cubic crystal, the crystallographic symmetry angle can be +45 degrees (e.g., in the <010> crystal direction). However, unlike Toader, the clamped mask/substrate is then rotated about the mask normal N by a small stitching angle, θ, prior to the first exposure. The first exposure to the incident radiation 31 therefore patterns layers of rods 37 and 39 parallel to the <010> lattice direction through mask openings 36 and 38, respectively. However, since the mask 35 is spaced from the photoresist 33 by spacer 44, the incident radiation 31 will enter the surface of the resist 33 at locations 47 and 49 at the spaced distance s from the mask openings 36 and 38, respectively, rather than directly under the mask openings, as would be the entry locations with the proximate mask of Toader. A second exposure is then performed, also at a 45 degree tilt angle but after rotating the clamped mask 35 and substrate 34 about the mask normal N by 180 degrees to pattern the other half of the logpile structure 30 into the resist 33. This is equivalent to performing the second exposure with the incident beam 31' at a −45 degree tilt angle with respect to the mask normal N. The second exposure to the incident radiation 31' therefore patterns layers of rods 37' and 39' parallel to the <100> lattice direction through the mask openings 36 and 38, respectively. Again, because the mask is spaced from the photoresist 33, the incident beam 31' will enter the surface of the resist at locations 47' and 49' at the spaced distance from the mask openings 36 and 38, respectively, rather than directly under the mask openings.

With Toader's method, if the proximate mask 25 is rotated 180 degrees but not repositioned after the first exposure, the second layer of rods would not be offset by a rod's width and would be patterned directly on top of the first layer. To prevent this overlaying with the method of the present invention, the mask 35 is spaced from the photoresist 33 and the clamped mask/substrate is rotated around the mask normal N by the small stitching angle θ prior to the first exposure. Accordingly, the second layer is offset by one rod's width from the first layer. As shown in FIG. 3A, the stitching angle θ can be selected so that the incident radiation 31' from the second exposure enters the photoresist 33 at locations 47' and 49' offset approximately one rod width w from the entry locations 47 and 49, respectively, of the incident radiation 31 from the first exposure. The stitching angle θ can be selected from simple geometry according to $$\tan \theta = 0.5 w/s \sim \theta$$

for small angles.

After the photoresist is patterned, it can be developed and released from the substrate. If a negative photoresist is used, the exposed regions are rendered insoluble and the unexposed regions of the resist will be removed by the developer, resulting in a tilted logpile structure comprising cross-hatched rods of the negative photoresist material. Examples of negative photoresists include epoxy-based materials, such as SU-8. Photoresist is a rather low-index dielectric material. Therefore, such a plastic photonic crystal might be used for filtering low frequency light or as a complex 3-D waveguide.

Conversely, if a positive photoresist is patterned, the exposed regions of the resist will be removed by the developer, resulting in an inverse tilted logpile structure comprising cross-hatched holes in the photoresist. An example of a positive photoresist material is PMMA. The inverse tilted logpile structure can be used as a template to mold a tilted logpile structure. For example, a LIGA process, as described above, can be used to fill the template mold with a plastic, metal, ceramic, glass, or other high-index dielectric material. Filling the holes with the dielectric material results in a tilted logpile structure comprising rods of the high-index dielectric material embedded in the photoresist matrix. Alternatively, the remaining photoresist material can be removed, resulting in a tilted logpile structure comprising rods of the high-index dielectric material with air as the second dielectric. For example, metals can be electroplated up from a conducting substrate, electroplated through the template holes, or deposited into the template holes by atomic layer deposition or other deposition techniques. For optical photonic crystals, the metal is preferably highly reflective in the wavelength range specified by the lattice constant. Common metals, such as gold, silver, or copper, can be used to fabricate photonic crystals in the visible. Tungsten, gold, or nickel, for example, are adequately reflective in the mid-infrared and can be used to fabricate photonic crystals in this spectral region. The photonic crystal can also comprise magnetic materials, such as NiFe, NiFeCo, NiCr, and NiCo alloys, for other applications.

Alternatively, a negative of the mask pattern shown in FIG. 3A can be used (i.e., the mask openings 36 and 38 can be replaced by X-ray absorbing material on a membrane substrate that is transparent to X-rays). If a positive photoresist is patterned with this negative mask, development of the patterned positive resist will produce a tilted logpile structure comprising cross-hatched rods of the positive photoresist material.

As shown in FIG. 3C, adjacent layers of the resulting tilted logpile are not quite parallel, but rather are skewed by twice the stitching angle. This skewness produces unit cells that deviate slightly from perfect cubes and are better described as rhomboids for larger stitching angles. Further, the surface photonic crystal structure that produces a photonic bandgap may only be a few unit cells deep into the structure before the adjacent layers separate or overlap too much to produce a photonic bandgap. Therefore, it is preferable to select as small a stitching angle and as large a spacer thickness as possible to minimize the skewness. However, angular tolerances and X-ray beam divergence can become problematic at large mask-photoresist spacings. Therefore, the stitching angle is preferably between about 0.1 and 10 degrees.

Consider the arrangement shown in FIGS. 3A and 3B, wherein s~/2d=c=4w for the face-centered-cubic unit cell. For this example, the stitching angle is θ~7 degrees. With this large stitching angle, adjacent layers will overlap completely (or be separated by a full log width) about one or two unit cells into the structure, as shown in FIG. 3C. Therefore, smaller stitching angles may be preferred to achieve a complete bandgap deep into the structure.

Now, consider a cubic photonic lattice comprising rods that are one micron wide with a unit cell size of four microns. This logpile structure has a photonic bandgap in the infrared. Assume a spacer that is 50 microns thick. Therefore, the stitching angle is θ~0.57 degrees. For this infrared tilted logpile, the layers of rods will substantially overlap or separate at a depth of about 20 microns (i.e., about 3 unit cells) into the structure.

In addition, to achieve wide electromagnetic bandgaps, photonic crystals require a network topology, wherein the rods are connected electrically in a continuous network throughout the structure. Therefore, with the normal logpile structures 10 or 20, each of the layers of rods touch the adjacent layers, to allow current flow, but do not overlap into the adjacent layers. However, with the tilted logpile 30 of the present invention, adjacent layers separate or overlap by the stitching angle into the structure away from the surface. Therefore, with the present invention, the rods are preferably 10% to 20% wider than the normal rods to ensure electrical contact between layers as they separate into the depth of the structure. Experiment and modeling both indicate that oversizing the rods by this amount has a negligible effect on the photonic crystal's optical performance.

In general, selecting an optimum stitching angle, spacer thickness, and dielectric material depends on the desired optical performance of the photonic crystal. If wide bandgaps are needed, then the photonic crystal can be fabricated with a metal, such as tungsten, silver, or gold, all of which provide a large index contrast. As described above, the layers of the tilted logpile are not quite parallel, but rather are skewed by twice the stitching angle. With a high-index-contrast material, the photonic crystal structure need only be a few unit cells thick to provide a complete bandgap. For example, Lin et al. found that a tungsten photonic crystal having a conventional face-centered-cubic logpile structure with a pitch between adjacent rods of d=4.2 microns, rod width of w=1.2 microns, and layer thickness of 1.6 microns (i.e., c=6.4 microns) provides a complete bandgap with very low transmittance in the infrared in only 6 layers (i.e., 1½ unit cells). See U.S. Pat. No. 6,611,085 to Fleming et al. Therefore, a surface structure only a few unit cells thick can generally provide a complete bandgap suitable for most applications and is easily fabricated by the method of the present invention.

The optical performance of the photonic crystal can also be modified by varying the lattice parameters and rod cross-sectional shape or dimension. The wavelength of the photonic bandgap can be modified by changing the lattice constant. The transmission and reflectivity can be modified by changing the geometry of the mask openings used in the mask pattern. The angle of incidence of the exposures can also be changed to create variations on the logpile structure. For example, changing the angle of incident with a mask having square mask openings creates a lattice of parallelograms instead of squares. Modifying the shape of the parallelogram (and the resulting rhombic rods) changes the photonic bandgap structure.

Fabrication of an Exemplary Tilted Logpile Photonic Crystal

A tilted logpile photonic crystal was fabricated according to the method of the present invention described above. Substrates were exposed by DXRL using the 1.3 GeV synchrotron light source at the Center for Advanced Microstructures and Devices at Louisiana State University. The X-ray beam was filtered using an 89° incidence mirror to provide a soft X-ray spectrum of 0.5 to 2 KeV photons. See C. Cuisin et al., Opt. Quant. Elec. 34, 13 (2002). The DXRL mask was fabricated by electroplating 0.75-μm thickness of gold onto a 1-μm thick silicon nitride membrane.

A 20-μm thick layer of PMMA photoresist was spin coated onto a gold-coated glass substrate. A 0.01-μm-thick titanium film was previously deposited onto the substrate to promote adhesion of the PMMA to the substrate. The mask was spaced from the photoresist by a 50-μm spacer. The mask-spacer-photoresist-substrate was then clamped together. An inverse tilted logpile structure was patterned using two exposures. The mask and substrate remained clamped together for both exposures. The first exposure was performed with the mask and substrate oriented at a 45° tilt angle to the X-ray beam and rotated by a stitching angle of 8 degrees with respect to the incident beam. The second exposure was performed after rotating the mask and substrate with respect to the incidence angle by an additional 180 degrees. This effectively changed the angle of incidence for the exposure from +45° to −45°, thereby patterning layers perpendicular to those exposed in the first exposure. The resulting pattern was a series of exposed cross-hatched layers entering the PMMA at a 45 degree angle. The 8 degree stitching angle provided enough offset so that the layers were shifted by one-half a lattice period with respect to each other at the surface of the PMMA. Therefore, the mask did not require repositioning between the two exposures. After the exposures, the PMMA was developed in GG developer using gravity assisted mixing. GG developer consisted of 60%2-(2-butoxyethody) ethanol, 20% tetrahydro-1.4-oxazine, 15% water, and 5% 2-aminoethanol. The developed resist was rinsed in GG rinse (20% water in 2-(2-butoxyethody) ethanol) and water. The titanium film was then removed to release the developed PMMA layer from the substrate. PMMA is a positive resist. Therefore, GG developer dissolved the exposed portions of the PMMA resist to provide an inverse tilted logpile structure comprising cross-hatched holes in the PMMA.

Figure 4:
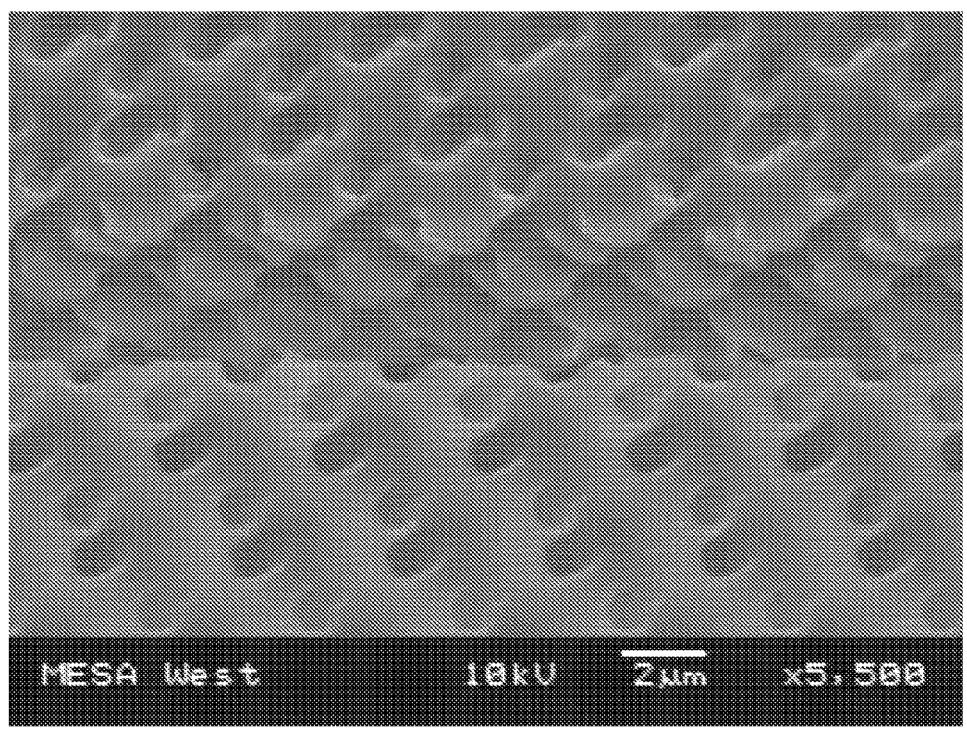
FIG. 4 shows a scanning electron micrograph (SEM) of an inverse tilted logpile structure after development of a patterned PMMA photoresist.

In FIG. 4 is shown a scanning electron micrograph (SEM) of the developed PMMA showing the inverse tilted logpile structure. The developed inverse logpile pattern within the PMMA can be seen as layers of cross-hatched holes moving from left to right, and right to left, in the middle of the SEM.

A LIGA process, as described above, was then used to fabricate a tilted logpile structure from the PMMA template mold using electroplated gold. After a titanium release etch, the developed PMMA was placed directly into a gold electroplating bath without drying. Gold was deposited into the developed pattern at a rate of 0.2-μm/min until the desired thickness was obtained. The resist was then stripped to provide a gold logpile with an air dielectric tilted with the <110> direction normal to the plane of the substrate.

Figure 5A:
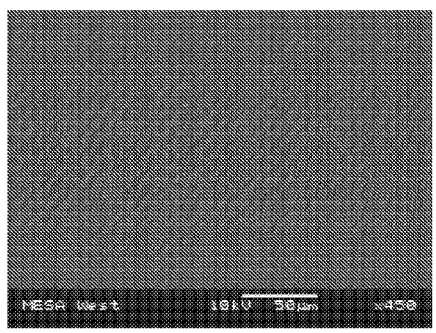
FIGS. 5A-5D show SEMs of gold-electroplated tilted logpiles comprising $2.2 \times 0.8$ $\mu m^2$ logs at a 4 μm pitch.
Figure 5B:
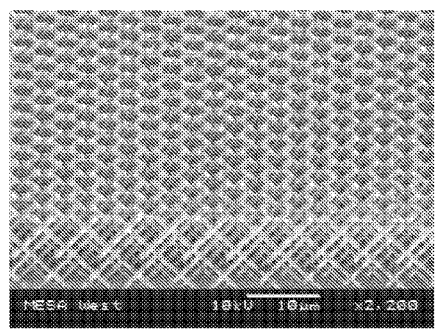
Figure 5C:
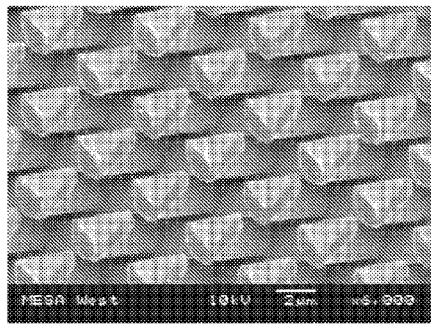
Figure 5D:
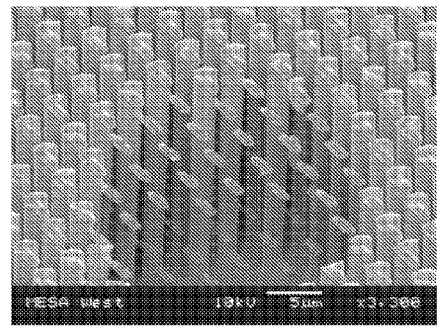

In FIGS. 5A-5D are shown SEMs of the gold-electroplated tilted logpile after the resist strip. The electroplated gold structures were plated 13-μm tall to produce just over 2 unit cells of photonic crystal in the <110> direction. The thinnest rods plated were 0.8-μm wide and about 2.2-μm thick with an aspect ratio of about 15:1. The areal size of the structure was 5-mm×5-mm. In FIG. 5A is shown a side-view SEM of the gold tilted logpile having a 250-μm field-of-view, oriented along the <111> direction. In FIG. 5B is shown a side-view SEM of the logpile with a 50-μm field-of-view. In FIG. 5C is shown a top-view SEM of the logpile with a 20-μm field-of-view oriented along the <110> direction. The SEM shows gaps between rows of connected column structures in the fabricated tilted logpile. In FIG. 5D is shown a 45° view SEM of a lattice defect oriented along the <100> direction.

Numerical Simulation of the Optical Properties of a Tilted Logpile Photonic Crystal Three-dimensional tilted logpile photonic crystals were modeled using a method-of-moments code. The code calculates the far-field efficiencies for reflected and transmitted modes from an infinite photonic crystal at an arbitrary incidence angle. Calculations were performed assuming linearly polarized transverse electric (TE) and transverse magnetic (TM) plane waves having wavelengths of 5 to 15 μm at different angles between the <100> and <010> directions of the crystal. Calculations assumed the physical geometries shown in FIGS. 5A to 5D. The logpile "logs" were assumed to be 2.2-μm wide and 1-μm thick gold rods. The fill dielectric material and substrate were air in the simulation. The lattice constant for the unit cell was 4 μm.

Figure 6:
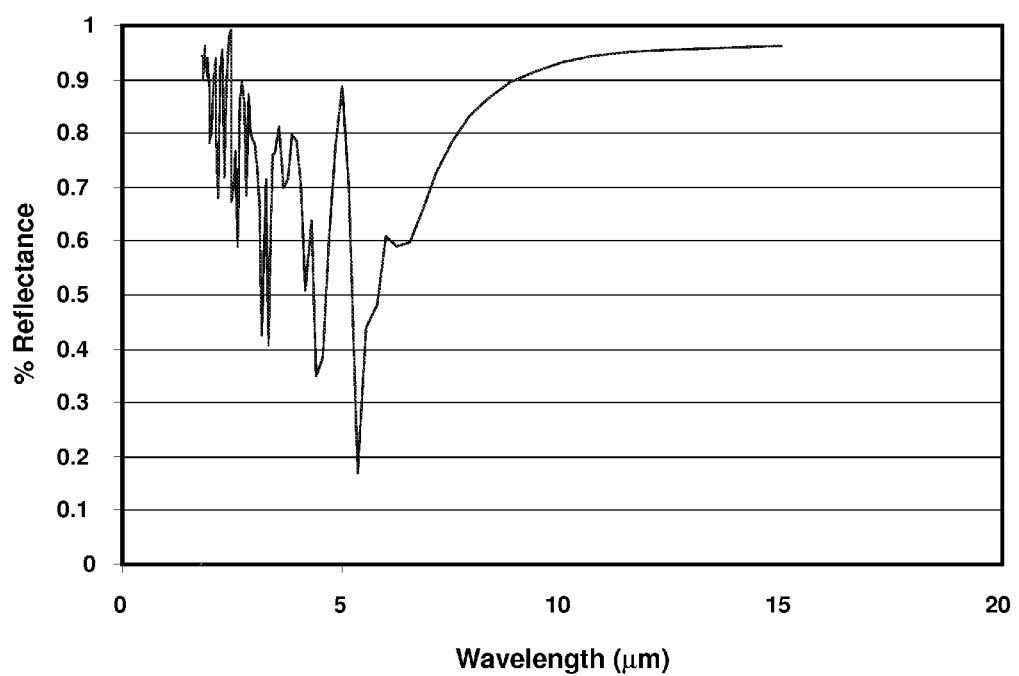
FIG. 6 shows graphs of the calculated total reflection of a gold tilted logpile photonic crystal structure between 5 and 15 micron wavelengths.

In FIG. 6 is shown a graph of the calculated total reflection of the structure between 5 and 15 microns along the <110> axis (i.e., normal to the substrate). The calculations indicate a band edge at 5 μm. The band edge is observed as a sharp increase in reflectivity due to Bragg coupling of the incident light with the photonic crystal structure. This Bragg coupling produces a bandgap in which the light cannot propagate into the photonic crystal and is therefore reflected off the surface.

Measured Optical Properties of a Tilted Logpile Photonic Crystal

Gold tilted logpile photonic crystals, fabricated as described above, were characterized with a hemispherical directional reflectometer (HDR) to determine the total, diffuse, and specular reflectivity of the photonic crystals. The HDR uses a reciprocal process to measure the total light reflected by a material from a source at a given incident angle. See J. T. Neu et al., *Proc. SPIE* 2260, 62 (1994).

Figure 7:
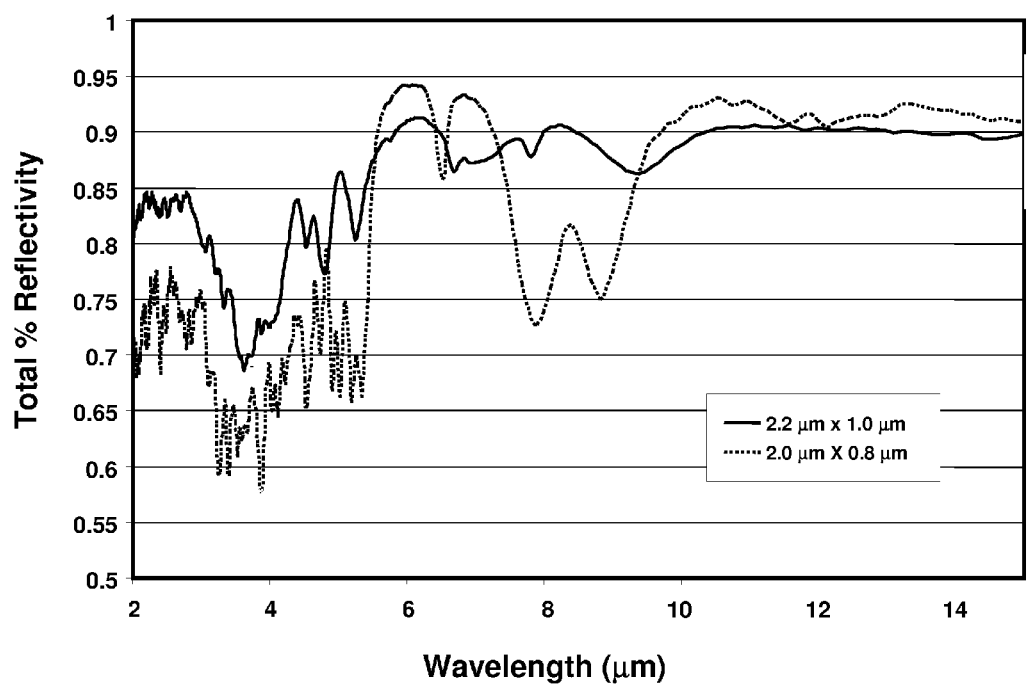
FIG. 7 shows graphs of the total reflected light from two different gold tilted logpile photonic crystals, fabricated according to the method of the present invention, indicating bandgaps at wavelengths between 5 and 15 microns.

In FIG. 7 are shown graphs of the total reflected light from two different gold tilted logpile photonic crystals fabricated as described above. The band structure of these tilted logpiles is very similar to the numerical simulations shown for the Toader-type tilted logpile structures in FIG. 6. One of the photonic crystals measured had rod cross sections of 2.2×1 μm$^2$. These crystals were fully dense, with no gaps between sets of cross rods when looking directly down on the lattice from the <110> direction (i.e., normal to the substrate). The other structure, comprising 0.8-μm-wide gold rods, had small spaces between layers of the photonic crystal, resulting in a loss of electrical contact. As the rod width decreases, a transmission window opens in the photonic band gap due to the separation of the skewed layers in the tilted logpile structure. The shape and location of this reflectivity dip is roughly centered between 8 and 12 micron wavelengths.

The measurements were taken assuming that the samples themselves were totally opaque at the wavelengths of interest and showed no infrared transmission, because the photonic structure is plated in gold on a thin, opaque gold film. Therefore, approximate emission curves can be generated by subtracting the total reflectivity of the sample from unity, according to E=1−R−T, where reflectivity, R, is the measured total reflectivity and transmission, T, is zero. Therefore, the emission peak typically present at wavelengths just below the bandgap is observed as a relatively sharp dip in the total reflection at wavelengths below 5 μm. See H. Yasumoto, *Electromagnetic Theory and Applications for Photonic Crystals*, CRC Press (2006).

Figure 8:
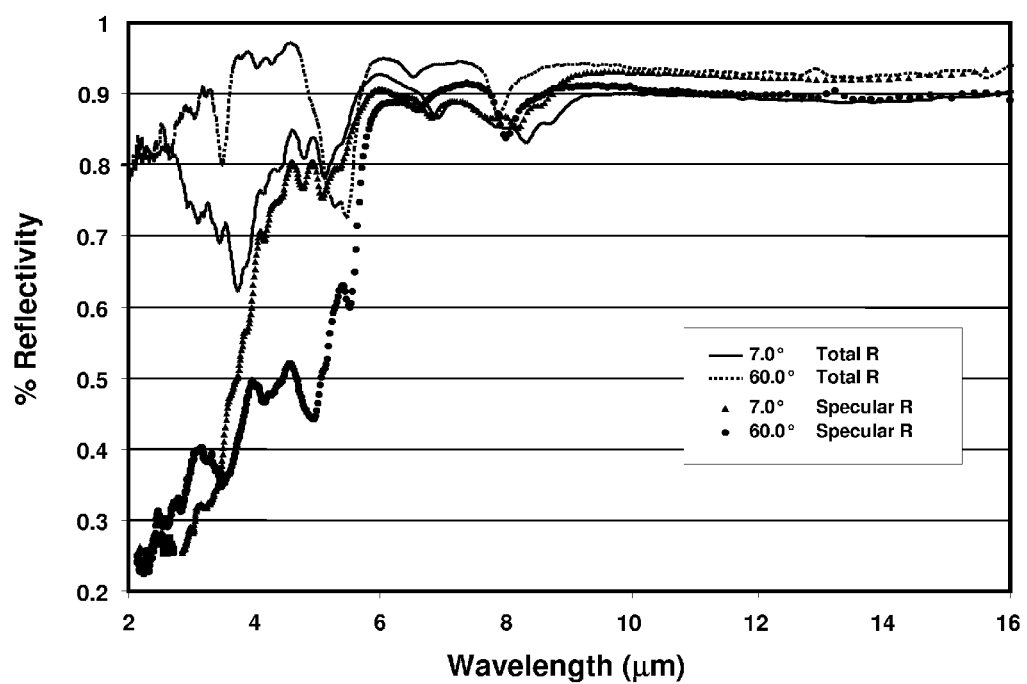
FIG. 8 shows graphs of the total and specular reflection for a fully dense tilted logpile photonic crystal at different angles of incident light.

Blocking the specular reflection in the HDR allows for the measurement of diffuse reflection of a sample. The specular reflection can then be calculated by subtracting the diffuse from the total (i.e., Specular=Total−Diffuse). In FIG. 8 are shown graphs of the total and specular reflection for a fully dense gold tilted logpile photonic crystal having rod cross sections of 2.2×1 μm$^2$ at angles of the incident light of 7° and 60° off-normal to the substrate along the x-y plane (i.e., lattice direction <110> to <1 0.27 0>). For these measurements, the incident light was shown parallel to the 5.6 μm (or long) axis of the tilted logpile structure. Data from light in the perpendicular direction (at different angles along the y-z axis) also demonstrated photonic lattice behavior along a different axis of the 3-D Bravais lattice. These results indicate the presence of a true, omnidirectional 3-D photonic bandgap in the tilted logpile photonic crystal.

The present invention has been described as a method to fabricate a tilted logpile photonic crystal. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to fabricate a tilted logpile photonic crystal, comprising:
   providing a substrate coated with a photoresist;
   providing a lithographic mask comprising a pattern of mask openings to pattern a tilted logpile structure in the photoresist with an incident beam from a collimated X-ray source;
   mounting the mask spaced a distance from the surface of the photoresist;
   tilting the mounted mask and substrate at a crystallographic symmetry angle toward the incident beam and aligning the incident beam with the mask openings;
   rotating the mounted mask and substrate through a stitching angle about the mask normal;
   exposing the photoresist to the incident beam through the mask openings to pattern a first half of the tilted logpile structure in the photoresist;
   rotating the mounted mask and substrate by 180 degrees about the mask normal; and
   exposing the photoresist to the incident beam through the mask openings to pattern a second half of the tilted logpile structure in the photoresist, thereby forming a tilted logpile structure patterned in the photoresist.

2. The method of claim 1, wherein the tilted logpile structure comprises a cubic or rhombic structure.

3. The method of claim 2, wherein the structure comprises a face-centered-cubic structure.

4. The method of claim 1, wherein the stitching angle is less than 10 degrees.

5. The method of claim 1, wherein the stitching angle θ is selected according to tan θ=0.5 w/s, where w is the width of the mask opening and s is distance spaced.

6. The method of claim 1, wherein the crystallographic symmetry angle is 45 degrees.

7. The method of claim 1, wherein the photoresist comprises a negative photoresist.

8. The method of claim 1, wherein the photoresist comprises a positive photoresist.

9. The method of claim 1, further comprising developing the patterned photoresist.

10. The method of claim 9, further comprising depositing a dielectric material into the holes of the developed photoresist.

11. The method of claim 10, wherein the depositing comprises electroplating or atomic layer deposition.

12. The method of claim 10, wherein the dielectric material comprises plastic, metal, ceramic, or glass.

13. The method of claim 12, wherein the metal comprises tungsten, gold, silver, nickel, or copper.

14. The method of claim 12, wherein the metal comprises NiFe, NiFeCo, NiCr, or NiCo alloy.

15. The method of claim 10, wherein the developed photoresist comprises an inverse tilted logpile structure.

16. The method of claim 15, wherein the remaining photoresist is removed to provide a tilted logpile structure comprising rods of the dielectric material in air.

* * * * *